(12) United States Patent
Dietz et al.

(10) Patent No.: US 12,204,006 B2
(45) Date of Patent: Jan. 21, 2025

(54) GRADIENT COIL UNIT COMPRISING TWO HOLLOW CYLINDER REGIONS

(71) Applicant: Siemens Healthineers AG, Forchheim (DE)

(72) Inventors: Peter Dietz, Fürth (DE); Stefan Stocker, Grossenseebach (DE); Simon Körber, Hallerndorf (DE); Andreas Krug, Fürth (DE)

(73) Assignee: Siemens Healthineers AG, Forchheim (DE)

( * ) Notice: Subject to any disclaimer, the term of this patent is extended or adjusted under 35 U.S.C. 154(b) by 67 days.

(21) Appl. No.: 18/119,451

(22) Filed: Mar. 9, 2023

(65) Prior Publication Data

US 2023/0288507 A1    Sep. 14, 2023

(30) Foreign Application Priority Data

Mar. 10, 2022  (EP) ..................................... 22161377

(51) Int. Cl.
*G01R 33/385* (2006.01)

(52) U.S. Cl.
CPC .................................. *G01R 33/385* (2013.01)

(58) Field of Classification Search
CPC .............. G01R 33/385; G01R 33/3854; G01R 33/3858
USPC ........................................ 324/322, 307, 300
See application file for complete search history.

(56) References Cited

U.S. PATENT DOCUMENTS

| | | | |
|---|---|---|---|
| 11,768,263 B2* | 9/2023 | Kirsch | G01R 33/3806 324/318 |
| 2005/0046422 A1 | 3/2005 | Edelstein et al. | |
| 2010/0085053 A1 | 4/2010 | Iwasa et al. | |
| 2015/0192650 A1 | 7/2015 | Takamori | |
| 2017/0371013 A1* | 12/2017 | Stocker | G01R 33/385 |
| 2019/0033405 A1 | 1/2019 | Fath et al. | |
| 2019/0331748 A1 | 10/2019 | Dietz | |
| 2021/0231759 A1 | 7/2021 | Bauer et al. | |
| 2022/0034983 A1* | 2/2022 | Bindseil | G01R 33/385 |

FOREIGN PATENT DOCUMENTS

| | | |
|---|---|---|
| CN | 106908746 A | 6/2017 |
| DE | 102017213026 A1 | 1/2019 |
| DE | 102018206643 A1 | 10/2019 |

(Continued)

*Primary Examiner* — Giovanni Astacio-Oquendo
(74) *Attorney, Agent, or Firm* — Banner & Witcoff Ltd.

(57) ABSTRACT

A gradient coil unit may include a hollow cylinder surrounding a cylinder axis, delimited perpendicularly to the cylinder axis by a first longitudinal end and a second longitudinal end opposing the first longitudinal end. The hollow cylinder may include a first hollow cylinder region and a second hollow cylinder region separated from the first hollow cylinder region by a sectional plane perpendicular to the cylinder axis. The first hollow cylinder region may be delimited by the first longitudinal end and the second hollow cylinder region by the second longitudinal end. The gradient coil unit may also include a conductor structure configured to generate magnetic field gradients in three mutually different directions. The gradient coil unit may have a length corresponding to a distance between the first longitudinal end and the second longitudinal end of at least 140 cm.

17 Claims, 3 Drawing Sheets

(56) References Cited

FOREIGN PATENT DOCUMENTS

| | | |
|---|---|---|
| DE | 202020100449 U1 | 2/2020 |
| EP | 3561534 A1 | 10/2019 |
| JP | S60157208 U | 10/1985 |

\* cited by examiner

GRADIENT COIL UNIT COMPRISING TWO HOLLOW CYLINDER REGIONS

CROSS REFERENCE TO RELATED APPLICATIONS

This patent application claims priority to European Patent Application No. 22161377.1, filed Mar. 10, 2022, which is incorporated herein by reference in its entirety.

BACKGROUND

Field

The disclosure relates to a gradient coil unit and to a magnetic resonance device.

Related Art

In a magnetic resonance device, the body of an examination object to be examined, in particular of a patient, is conventionally exposed in a patient-receiving region to a relatively high main magnetic field, for example of 1.5, 3 or 7 tesla, with the aid of a main magnet. In addition, gradient pulses are played out with the aid of a gradient coil unit. High-frequency radio-frequency pulses (RF pulses), in particular excitation pulses, are then emitted by a radio-frequency antenna unit by means of suitable antenna facilities, and this results in the nuclear spins of particular atoms resonantly excited by way of these RF pulses being tilted about a defined flip angle with respect to the magnetic field lines of the main magnetic field. On relaxation of the nuclear spins, radio-frequency signals, what are known as magnetic resonance signals, are irradiated, which are received by means of suitable radio-frequency antennas and then processed further. Finally, the desired image data can be reconstructed form the raw data acquired in this way. The examination object is positioned at least partially inside the examination region. The examination region is typically the spatial region from which raw data is acquired.

A gradient coil unit is typically configured for generating magnetic field gradients in at least two, preferably in three, directions. For this, the gradient coil unit has conductor structures. The gradient coil unit is controlled with electrical currents whose amplitudes reach several 100 A and which are subject to frequent and rapid changing of the current direction with slew rates of several 100 kA/s. Owing to the positioning of the gradient coil unit inside the main magnet of the magnetic resonance device, a large force is produced, which acts on the gradient coil unit. A torque is linked to the force, and this can result in a movement and/or bending of the gradient coil unit. This can result in vibration during operation of the gradient coil unit. The conductor structures are typically connected together by a casting material and, in particular, are cast in such a way that they are in a fixed arrangement relative to each other and, typically together with the casting material, form a hollow cylinder. Vibrations and/or mechanical forces can destroy the casting material and the conductor structures during operation of the gradient coil unit.

Relatively strong magnetic field gradients and/or slew rates typically enable faster capture of raw data and/or a higher resolution of image data. In particular with examinations of the head of an examination object, especially with diffusion-weighted scans and/or with use of a magnetic resonance device having a main magnetic field of more than 3 tesla, especially strong magnetic field gradients of up to 250 mT/m with slew rates of up to 1,000 T/s/m, in particular cases up to 2,000 T/s/m, are desirable. Especially high forces occur here from which vibrations can result. In particular, natural frequencies, resonance frequencies therefore, of the gradient coil unit can also be excited, which cause the gradient coil unit to vibrate and can destroy it. Customarily, prohibited frequency ranges, at which the gradient coil must not be actuated, are defined for the slew rates in order to avoid such vibrations.

DE 20 2020 100 449 describes an apparatus for avoiding mechanical stresses and mechanical boundary surface damage, such as delaminations owing to thermal and chemical processes after casting, in particular as the casting material cures. Other developments for such powerful gradient coil units relate to improved stray field compensation, such as EP3561534, improved force compensation, such as DE 10 2018 206 643, and/or an integrated shimming, such as DE 2017 213 026.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
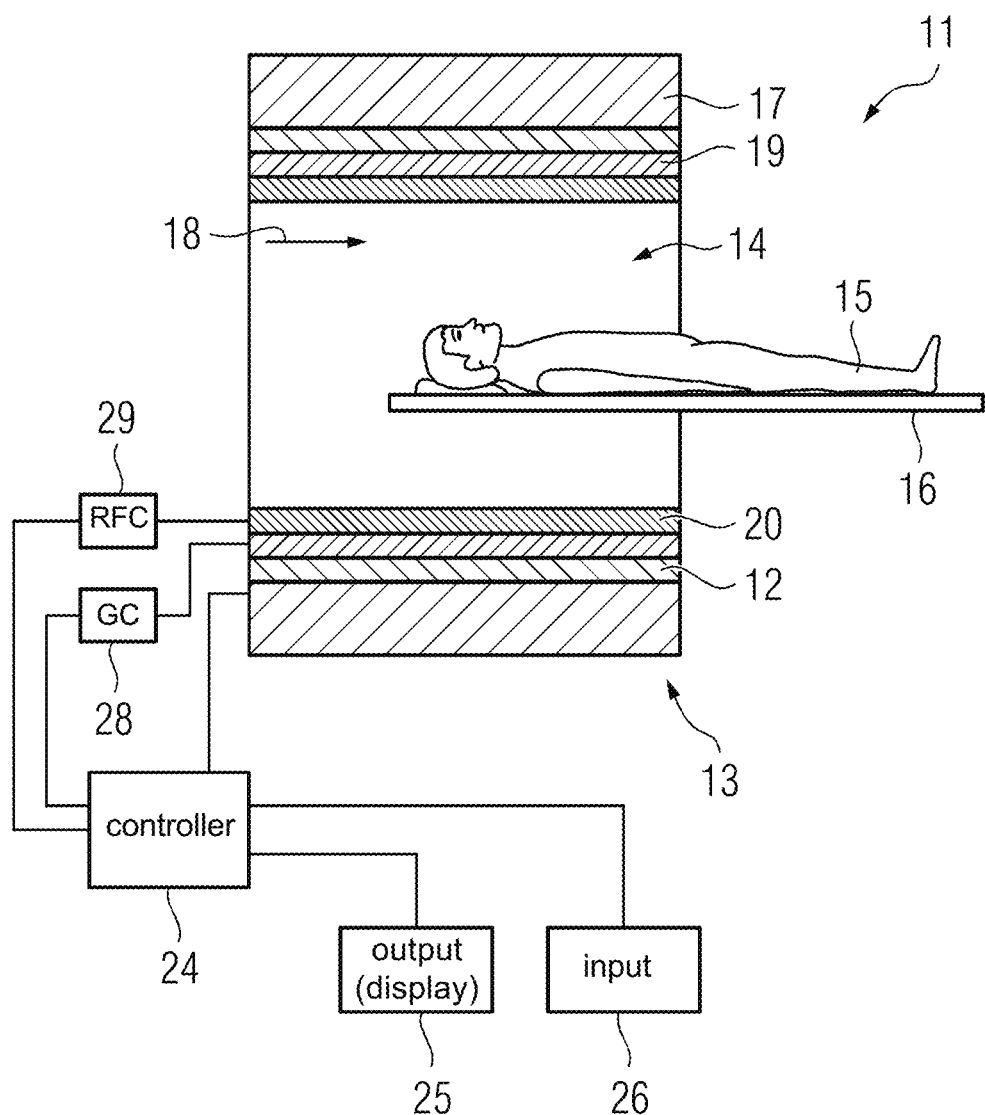
FIG. 1 shows a magnetic resonance device according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide a robust and low-vibration gradient coil unit, in particular also for slew rates of more than 500 T/s/m.

The inventive gradient coil unit is according to exemplary embodiments may be designed as a hollow cylinder surrounding a cylinder axis and is delimited perpendicularly to the cylinder axis by a first longitudinal end and a second longitudinal end opposing it. The gradient coil unit has a length corresponding to a distance between the first longitudinal end and the second longitudinal end of at least 140 cm and comprises a conductor structural unit configured to generate magnetic field gradients in three mutually different directions. The hollow cylinder comprises a first hollow cylinder region and a second hollow cylinder region, which second hollow cylinder region is separated from the first hollow cylinder region by a sectional plane perpendicular to the cylinder axis and the first hollow cylinder region is delimited by the first longitudinal end and the second hollow cylinder region by the second longitudinal end. The first hollow cylinder region is free from the conductor structural unit.

In an exemplary embodiment, the conductor structural unit comprises at least three conductor structures, with the at least three conductor structures each differing in their radial spacing from the cylinder axis. All conductor structures encompassed by the conductor structural unit may each differ from one other in their radial spacing from the cylinder axis. The three mutually different directions may be orthogonal to one another. A conductor structure typically comprises an electrical conductor. The geometric arrangement of an electrical conductor can be referred to as a conductor structure. A magnetic field gradient may be a magnetic field gradient of the first order. The conductor structural unit can comprise at least four conductor structures, with at least two of the at least four conductor structures being designed to jointly generate a magnetic field gradient in one direction. The current source preferably comprises a gradient amplifier unit. The current source may be configured to generate an electrical current of at least 700 A, preferably of at least 900 A, particularly preferably of at least 1,100 A. The gradient coil unit can comprise the current source.

In an exemplary embodiment, the current source may be electrically connected to the conductor structural unit, with the electrical connection preferably comprising a supply line. The electrical connection can comprise a gradient connecting cable, which is arranged outside of the hollow gradient coil unit and/or connects to gradient connections encompassed by the gradient coil unit. The supply line may be spatially integrated in the gradient coil unit. The supply line connects the conductor structural unit preferably directly to a gradient connection. The function of the supply line may be limited to forwarding the electrical current to the conductor structural unit. An electrical current in the supply line does not typically contribute to the spatial generation and/or configuration of a magnetic field gradient generated by the conductor structural unit.

The outer form of the gradient coil unit is typically hollow cylindrical in shape. The length of the gradient coil unit along the cylinder axis is typically at least 140 cm, preferably at least 150 cm, particularly preferably at least 155 cm. The length of the gradient coil unit along the cylinder axis is typically at most 200 cm, preferably at most 175 cm, particularly preferably at most 165 cm. The length of the second hollow cylinder region parallel to the cylinder axis is typically at least 100 cm, preferably at least 110 cm, particularly preferably at least 120 cm. The length of the second hollow cylinder region parallel to the cylinder axis is typically at most 150 cm, preferably at most 140 cm, particularly preferably at most 130 cm.

The gradient coil unit may be formed by two hollow cylinder regions consecutively arranged along the cylinder axis, in particular the first hollow cylinder region and the second hollow cylinder region. The external radius of the first hollow cylinder region preferably corresponds to the external radius of the second hollow cylinder region. The radial spatial extent, in particular the wall thickness, of the first hollow cylinder region preferably corresponds to the radial spatial extent of the second hollow cylinder region. Along the cylinder axis the second hollow cylinder region typically has a greater spatial extent, in particular length, than the first hollow cylinder region. The first hollow cylinder region is typically free from an electrical conductor and/or free from electrically conductive material and/or the supply line. The first hollow cylinder region can alternatively encompass the supply line. The radial spatial extent of the first hollow cylinder region and/or the second hollow cylinder region may be less than 200 mm, particularly preferably less than 190 mm.

The first hollow cylinder region makes it possible to reinforce the gradient coil unit, so resulting forces and vibrations during operation of the gradient coil unit are reduced. The fact that the first hollow cylinder region is free from the conductor structural unit and therewith preferably free from electrical currents and forces resulting therefrom, makes it possible to change the resonance frequency especially efficiently. In particular, the first hollow cylinder region can increase the resonance frequency of particular vibration modes of the gradient coil unit in such a way that it can no longer be excited during operation of the gradient coil unit. In addition, the prohibited frequency ranges of the gradient coil unit can consequently be reduced, making a broader range of applications possible. The resonance frequencies and/or vibration modes of the gradient coil unit can be modified and controlled by appropriate selection of the size and material of the first hollow cylinder region. In particular, the resonance frequencies can be consolidated in such a way that they can be covered by an optimally narrow prohibited frequency range. Vibration amplitudes can be reduced by appropriate selection of the size and material of the first hollow cylinder region.

One embodiment of the gradient coil unit provides that the first hollow cylinder region has a length of at least 25 cm parallel to the cylinder axis. The length of the first hollow cylinder region parallel to the cylinder axis is typically between 25 cm and 60 cm, preferably between 30 cm and 50 cm, particularly preferably between 35 cm and 45 cm. Such a length of the first hollow cylinder region makes sufficient volume possible for reinforcing the gradient coil unit, with the patient-receiving region, which is arranged inside the hollow cylinder, not being unnecessarily lengthened at the same time. This is advantageous in particular for claustrophobic patients.

One embodiment of the gradient coil unit provides that the second hollow cylinder region completely encompasses the conductor structural unit. According to this embodiment, the conductor structural unit is concentrated on the second hollow cylinder region and enables particularly efficient reinforcing of the gradient coil unit by the first hollow cylinder region, by which no forces and/or vibrations are actively generated. Instead, the first hollow cylinder region is configured in such a way that forces and/or a force coupling is minimized and the excitation, and therewith the vibration amplitude of particular modes, is consequently reduced.

One embodiment of the gradient coil unit provides that the conductor structural unit is surrounded by casting compound, in particular by epoxy resin. The conductor structural unit may be completely surrounded by the casting compound. The casting compound is typically encompassed by the second hollow cylinder region. The conductor structural unit is typically protected by the casting compound. The surface of the casting compound preferably corresponds to the surface of the gradient coil unit and/or the second hollow cylinder region. This enables particularly good protection and insulation of the conductor structure. In addition, the casting compound makes a good compromise possible between flexibility and rigidity for absorption of forces.

One embodiment of the gradient coil unit provides that the first hollow cylinder region comprises reinforcing fibers. The first hollow cylinder region preferably comprises at least partially a reinforcing material, which comprises reinforcing fibers. The reinforcing fibers can be arranged only in one section of the first hollow cylinder region, with the region of the first hollow cylinder region outside of the section providing the same casting compound, by which casting compound the conductor structural unit in the second hollow region is also surrounded. The section preferably comprises the reinforcing material. The proportion of the volume of the reinforcing fibers in the volume of the section is typically between 60% and 80%, preferably between 65% and 75%, particularly preferably between 68% and 72%. The second hollow cylinder region may be free from reinforcing fibers. The second hollow cylinder region can comprise reinforcing fibers, with the proportion of the reinforcing fibers in the second hollow cylinder region being lower than the proportion of the reinforcing fibers in the first hollow cylinder region. The reinforcing fibers typically reduce the flexibility and/or increase the rigidity of the gradient coil unit. This causes a reduction of amplitudes owing to vibrations of the gradient coil unit, in particular in the case of a resonance frequency. Similarly, stresses in the first hollow cylinder region and/or the second hollow cylinder region and/or in a material encompassed by it are reduced. This increases, in particular, the robustness of the gradient coil unit and protects it against destruction, in particular also in the case of slew rates of more than 500 T/s/m.

One embodiment of the gradient coil unit provides that a density of the casting compound and a density of the reinforcing fibers and/or of the reinforcing material comprising the reinforcing fibers differs by at most 5%, preferably by at most 2%, particularly preferably by at most 1%. The density of the casting compound preferably corresponds to the density of the reinforcing fibers and/or the density of the reinforcing material comprising the reinforcing fibers. Such a selection of the reinforcing fibers and/or of the reinforcing material makes it possible for the density inside the first hollow cylinder region and/or at the transition between first hollow cylinder region and second hollow cylinder region, in the sectional plane therefore, to not change, or to change only slightly, and thus the reinforcing fibers influence only the resonance frequency and/or the vibration modes. Compared to a first hollow cylinder region made of casting material free from reinforcing fibers, global modes are unchanged. This increases the compatibility with customary gradient coil units.

One embodiment of the gradient coil unit provides that the rigidity of the reinforcing fibers is at least twice as high as the rigidity of the casting compound. The rigidity of the reinforcing fibers is typically between 25 GPa and 45 GPa, preferably between 30 GPa and 40 GPa, particularly preferably between 32 GPa and 36 GPa. The rigidity of the casting compound is typically between 5 GPa and 20 GPa, preferably between 8 GPa and 16 GPa, particularly preferably between 10 GPa and 14 GPa. The rigidity of the reinforcing fibers may be at least 2.5 times, particularly preferably at least three times as high as the rigidity of the casting compound. The rigidity of the reinforcing fibers may be at most six times, particularly preferably at least five times as high as the rigidity of the casting compound. This enlarges the linear region of the restoring forces, whereby the resonance frequency can be particularly efficiently changed.

One embodiment of the gradient coil unit provides that the reinforcing fibers at the inner side directed toward the cylinder axis and/or at the outer side remote from the cylinder axis are covered by the casting compound. The first hollow cylinder region accordingly preferably comprises reinforcing fibers and casting compound, it being possible for the reinforcing fibers to be cast with the casting compound. The reinforcing fibers can be arranged only in one section of the first hollow cylinder region, with the region of the first hollow cylinder region outside of the section providing the same casting compound, by which casting compound the conductor structural unit is also surrounded in the second hollow region. If the first hollow cylinder region comprises reinforcing fibers and casting compound, the transition between first hollow cylinder region and second hollow cylinder region can thus be particularly continuously configured. This can increase the stability of the gradient coil unit. The section of the first hollow cylinder region comprising the reinforcing fibers may be hollow cylindrical in shape and/or free from casting compound. This section may be covered at the inner side directed toward the cylinder axis and at the outer side remote from the cylinder axis by the casting compound. This makes a continuous surface quality of the gradient coil unit possible, which consequently becomes particularly robust. The section of the first hollow cylinder region comprising the reinforcing fibers can also be part of the outer side remote from the cylinder axis, so the first hollow cylinder region comprises casting compound at the inner side and reinforcing fibers at the outer side. This is particularly advantageous since particularly high forces act at the outer side of the gradient coil unit remote from the cylinder axis and reinforcing thereof is particularly efficient.

One embodiment of the gradient coil unit provides that the reinforcing fibers are oriented in the circumferential direction of the first hollow cylinder region, in particular act tangentially. This makes a particularly efficient increase in the rigidity and a reduction of the radial forces possible, in particular a reduced force coupling, whereby vibrations can be prevented particularly effectively.

One embodiment of the gradient coil unit provides that a radial spatial extent of the reinforcing fibers corresponds to at least 20%, preferably at least 30%, particularly preferably at least 40% of a radial spatial extent of the first hollow cylinder region. A section of the first hollow cylinder region comprising the reinforcing fibers may be hollow cylindrical in shape, with the radial spatial extent, the wall thickness of the section therefore, preferably being less than half as great as the wall thickness of the first hollow cylinder region.

The radial spatial extent of the reinforcing fibers is typically at most 80%, preferably at most 65%, particularly preferably at most 50% of a radial spatial extent of the first hollow cylinder region.

Such a first hollow cylinder region is particularly stable, increases resonance frequencies and reduces amplitudes of resonances.

One embodiment of the gradient coil unit provides that the reinforcing fibers comprise at least one of the following materials: glass, carbon, and/or glass fiber reinforced plastic (GRP).

Such materials are easy to handle and have an advantageous density and rigidity, so the resonance frequencies of the gradient coil unit can be efficiently changed, in particular in combination with epoxy resin as the casting compound. In particular, a mixture of these materials can also be used, whereby wide-ranging influencing of the resonance frequencies of the gradient coil unit is possible.

One embodiment of the gradient coil unit provides that the conductor structural unit comprises at least five conductor structures each with different radial spacings from the cylinder axis. A first conductor structure and a second conductor structure of the at least five conductor structures are configured to jointly generate a magnetic field gradient in a first direction of the three directions. A third conductor structure of the at least five conductor structures is configured to compensate for a stray magnetic field resulting on generation of a magnetic field gradient by means of first conductor structure and/or second conductor structure.

The first conductor structure may be shorter in the longitudinal direction, parallel to the cylinder axis therefore, than the second conductor structure and the third conductor structure. The third conductor structure surrounds the second conductor structure preferably at least partially radially and the second conductor structure surrounds the first conductor structure preferably at least partially radially. The first conductor structure and/or the second conductor structure may be configured to compensate a torque on the gradient coil unit resulting on generation of the magnetic field gradient in the first direction. The gradient coil unit may be designed so it can be flexibly positioned inside a patient-receiving region of a magnetic resonance device and/or as a local gradient coil unit.

A fourth conductor structure of the at least five conductor structures can be configured, alone or together with a further conductor structure, to generate a magnetic field gradient in a second direction of the three directions. A fifth conductor structure of the at least five conductor structures can be configured, alone or together with a further conductor structure, to generate a magnetic field gradient in a third direction of the three directions. The arrangement and the mode of operation of the conductor structures can correspond in particular to the gradient coil unit described in DE 10 2018 206 643.

Such a gradient coil unit is configured to generate particularly high magnetic field gradients and due to the use of the first conductor structure and the second conductor structure already has an option for force compensation. The first hollow cylinder region free from the conductor structural unit brings about a further stabilization of such a gradient coil unit and enables safe operation.

One embodiment of the gradient coil unit provides that the conductor structural unit is asymmetrically designed in relation to each plane perpendicular to the cylinder axis. In particular, local gradient coil units configured to record the head of an examination object, with appropriate asymmetrical selection of the conductor structural unit, make a particularly high amplitude and particularly high slew rates possible, so reinforcing of the gradient coil unit by using the first hollow cylinder region is particularly advantageous.

One embodiment of the gradient coil unit provides that a radial spatial extent of the first hollow cylinder region is smaller than a radial spatial extent of the second hollow cylinder region. In particular, with a design of the gradient coil unit as a local gradient coil unit configured solely to record a head of an examination object, it is advantageous if the gradient coil unit at the first longitudinal end has a larger internal radius than at the second longitudinal end. This makes comfortable positioning of the examination object inside the gradient coil unit possible since the shoulder region of the examination object can be positioned inside the first hollow cylinder region with the larger internal radius. The head region of the examination object, which is typically smaller than their shoulder region, is to be arranged inside the second hollow cylinder region with the smaller internal radius. Such an embodiment is advantageous in the case of gradient coil units configured to record an entire body of an examination object too since a patient-receiving region that is also only partially larger increases the comfort of the patient. Since it is possible to omit conductor structures and corresponding cooling in the first hollow cylinder region, the radial spatial extent can be designed to be smaller without any loss.

The disclosure starts, moreover, from a magnetic resonance device comprising a main magnet, a shim cage configured to receive shim irons, a radio-frequency coil unit and an inventive gradient coil unit, wherein the shim cage is arranged between the main magnet and the gradient coil unit and the gradient coil at at least one radial position parallel to the cylinder axis has a greater length than the shim cage.

The main magnet may be configured to generate a main magnetic field of at least 3 tesla, particularly preferably of at least 7 tesla. The main magnet may be designed to be hollow cylindrical in shape. The shim cage may be designed to be hollow cylindrical in shape and is arranged in the region at least partially enclosed by the main magnet. The gradient coil unit may be arranged in the region at least partially enclosed by the shim cage. The shim cage is typically arranged between main magnet and gradient coil unit.

Shim irons are typically plates and/or shapes made of metal, in particular made of iron. Shim irons are typically arranged during the course of the installation of the magnetic resonance device at defined positions on the hollow cylindrical inner side of the main magnet for homogenization of the main magnetic field. The shim cage can comprise metal and/or GRP.

The outer surface of the gradient coil unit is typically arranged so as to have no contact with the inner side of the shim cage and isolated therefrom, for example by Sylomer®. In particular, a positioning aid configured to assist positioning of the gradient coil unit inside the shim cage can comprise Sylomer®. If the length of the gradient coil unit at at least one radial position is at least as great as the length of the shim cage parallel to the cylinder axis, the gradient coil unit can be isolated from the shim cage particularly effectively. In particular, the first hollow cylinder region can additionally stabilize the gradient coil unit.

Embodiments of the inventive magnetic resonance device are configured analogously to the embodiments of the inventive gradient coil unit. The advantages of the inventive magnetic resonance device substantially correspond to the advantages of the inventive gradient coil unit, which have been stated above in detail. Features, advantages or alternative embodiments mentioned here can similarly also be transferred to the other claimed subject matters, and vice versa.

FIG. 1 shows an inventive magnetic resonance device 11 in a schematic representation. The magnetic resonance device 11 comprises a scanner 13 having a main magnet 17 for generating a strong and, in particular, constant main magnetic field 18. In addition, the magnetic resonance device 11 has a cylindrical patient-receiving region 14 for receiving a patient 15, with the patient-receiving region 14 being cylindrically enclosed by the scanner 13 in a circumferential direction. The patient 15 can be pushed into the patient-receiving region 14 by means of a patient-positioning apparatus 16 of the magnetic resonance device 11. The patient-positioning apparatus 16 has for this purpose a patient table, which is movably arranged inside the magnetic resonance device 11.

The scanner 13 comprises an inventive gradient coil unit 19, which is used for spatial encoding during imaging. The gradient coil unit 19 is actuated by means of a gradient controller 28. The gradient controller 28 typically comprises a current source. The scanner 13 comprises a shim cage 12, which is configured to receive shim irons. The shim cage 12 is typically arranged between gradient coil unit 19 and main magnet 17. The length of the gradient coil unit 19 parallel to the main magnetic field 18 may be greater than the length of the shim cage 12. Furthermore, the scanner 13 has a radio-frequency antenna unit 20, which in the case shown is designed as a body coil permanently integrated in the magnetic resonance device 11, and a radio-frequency antenna controller 29 for exciting a polarization, which establishes itself in the main magnetic field 18 generated by the main magnet 17. The radio-frequency antenna unit 20 is actuated by the radio-frequency antenna controller 29 and irradiates high-frequency radio-frequency pulses into an examination space, which is formed substantially by the patient-receiving region 14.

For controlling the main magnet 17, the gradient controller 28 and the radio-frequency antenna controller 29, the magnetic resonance device 11 has a controller 24. The controller 24 centrally controls the magnetic resonance device 11, such as carrying out MR control sequences. In addition, the controller 24 comprises a reconstruction unit (not shown) for reconstructing medical image data, which is captured during the magnetic resonance examination. The magnetic resonance device 11 has a display unit 25. Control information such as control parameters for example, and reconstructed image data can be displayed on the display unit 25, for example on at least one monitor, for a user. In addition, the magnetic resonance device 11 has an input unit 26, by means of which information and/or control parameters can be input by a user during a measuring process. The controller 24 can comprise the gradient controller 28 and/or radio-frequency antenna controller 29 and/or the display unit and/or the input unit 26. In an exemplary embodiment, the controller 24 includes processing circuitry configured to perform one or more operations and/or functions of the controller 24. One or more components of the controller 24 may include processing circuitry configured to perform one or more respective operations and/or functions of the component(s).

The represented magnetic resonance device 11 can of course comprise further components, which magnetic resonance devices 11 usually have. A general mode of operation of a magnetic resonance device 11 is known to a person skilled in the art, moreover, so a detailed description of the further components will be omitted.

Figure 2:
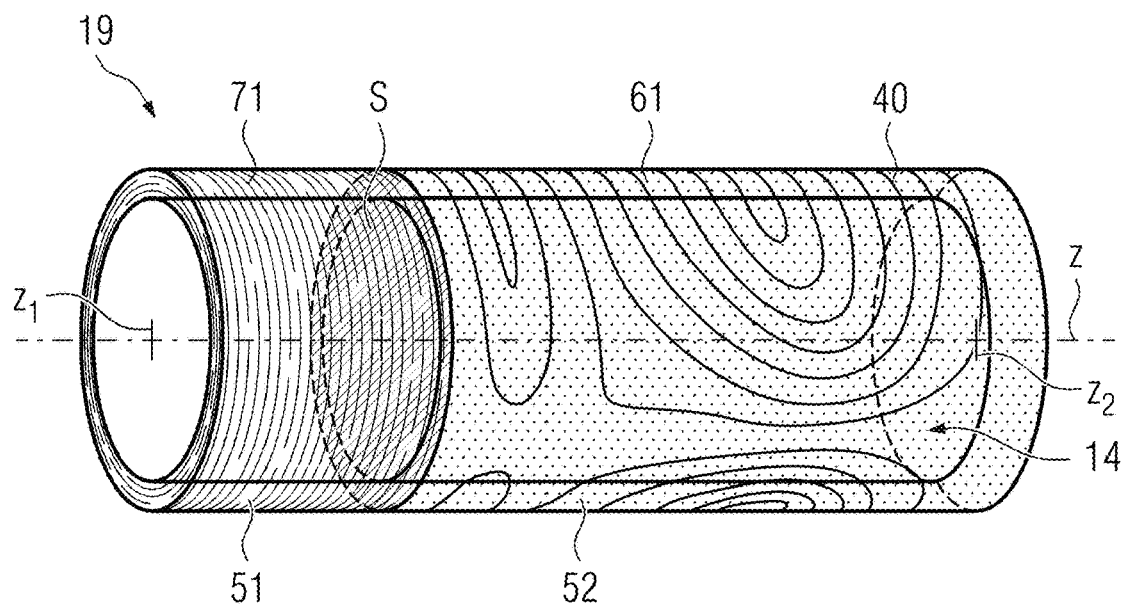
FIG. 2 shows a gradient coil unit according to an exemplary embodiment of the present disclosure.

FIG. 2 shows an inventive gradient coil unit 19 in a first embodiment in a schematic representation. The gradient coil unit 19 is designed as a hollow cylinder surrounding a cylinder axis z, with this being delimited perpendicularly to the cylinder axis z by a first longitudinal end z1 and a second longitudinal end z2 opposing it. The distance between the first longitudinal end z1 and the second longitudinal end z2 is at least 140 cm. The gradient coil unit 19 comprises a conductor structural unit 40 configured to generate magnetic field gradients in three mutually different directions. The hollow cylinder comprises a first hollow cylinder region 51 and a second hollow cylinder region 52, which is separated from the first hollow cylinder region by a sectional plane S perpendicular to the cylinder axis z, with the first hollow cylinder region 51 being delimited by the first longitudinal end z1 and the second hollow cylinder region 52 by the second longitudinal end z2. The first hollow cylinder region 51 is free from the conductor structural unit 40. The second hollow cylinder region 52 completely encompasses the conductor structural unit 40. The conductor structural unit 40 is surrounded by a casting compound 61. The conductor structural unit 40 is asymmetrically designed in relation to each plane perpendicular to the cylinder axis z, asymmetrical in relation to each plane parallel to the sectional plane S therefore. The spacing of the first longitudinal end z1 from the sectional plane S may be at least 25 cm. The first hollow cylinder region 51 comprises reinforcing fibers 71, which are oriented in the circumferential direction of the first hollow cylinder region 51.

Figure 3:
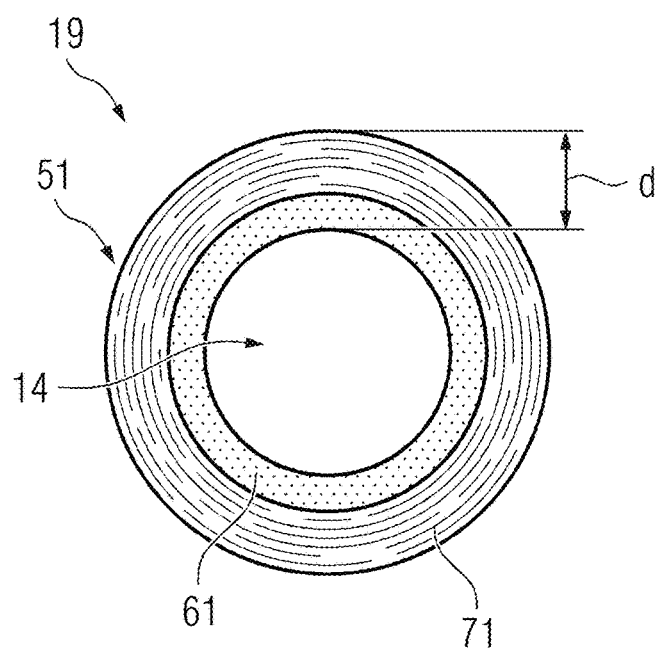
FIG. 3 shows a first hollow cylinder region according to an exemplary embodiment of the present disclosure.

FIG. 3 shows a first hollow cylinder region 51 of a second embodiment in a schematic representation in a plane parallel to the sectional plane S. In this embodiment the reinforcing fibers 71 at the inner side directed toward the cylinder axis z are covered by the casting compound 61 and the radial spatial extent of the reinforcing fibers 71 corresponds to at least 20% of a radial spatial extent of the first hollow cylinder region 51, which can also be referred to as wall thickness d.

Figure 4:
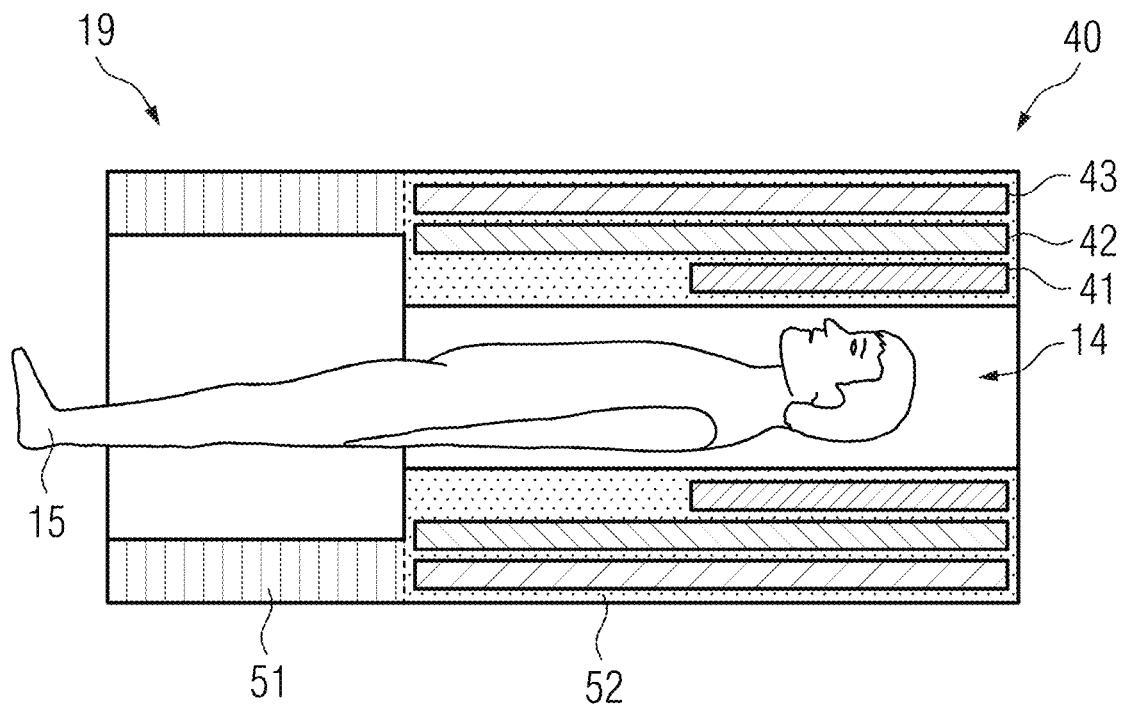
FIG. 4 shows a gradient coil unit according to an exemplary embodiment of the present disclosure.

FIG. 4 shows an inventive gradient coil unit 19 in a third embodiment in a schematic representation. The radial spatial extent of the first hollow cylinder region 51 is smaller than the radial spatial extent of the second hollow cylinder region 52.

The conductor structural unit 40 comprises at least five conductor structures, of which, for the sake of improved identifiability, only three of the at least five conductor structures 41, 42, 43 are represented. The at least five conductor structures 41, 42, 43 each have a different radial spacing from the cylinder axis z.

A first conductor structure 41 and a second conductor structure 42 of the at least five conductor structures 41, 42, 43 are configured to jointly generate a magnetic field gradient in a first direction of the three directions. A third conductor structure 43 of the at least five conductor structures 41, 42, 43 is configured to compensate a stray magnetic field resulting on generation of a magnetic field gradient acting in the first direction by means of first conductor structure and/or second conductor structure. The conductor structural unit 40 preferably comprises three further conductor structures, with two of the three further conductor structures being configured to jointly generate a magnetic field gradient in a second direction of the three directions. A third of the three further conductor structures is configured to compensate a stray magnetic field resulting on generation of a magnetic field gradient acting in the second direction. The first direction preferably corresponds to the x-direction or the y-direction. The second direction preferably corresponds to the x-direction or the y-direction. The first direction may be orthogonal to the second direction. The conductor structural unit 40 typically also comprises at least one z-conductor structure configured to generate a magnetic field gradient in the z-direction. The conductor structural unit 40 typically also comprises at least one z-shield conductor structure configured to compensate a stray magnetic field resulting on generation of a magnetic field gradient in the z-direction. All conductor structures encompassed by the conductor structural unit 40, in particular encompassing the z-conductor structure and the z-shield conductor structure, differ from each other respectively at least in their radial spacing from the cylinder axis z.

Although the disclosure has been illustrated and described in detail by the preferred exemplary embodiments, it is not limited by the disclosed examples and a person skilled in the art can derive other variations herefrom without departing from the scope of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A gradient coil unit comprising:
a hollow cylinder surrounding a cylinder axis, delimited perpendicularly to the cylinder axis by a first longitudinal end and a second longitudinal end opposing the first longitudinal end, the hollow cylinder including a first hollow cylinder region and a second hollow cylinder region separated from the first hollow cylinder region by a sectional plane perpendicular to the cylinder axis, wherein the first hollow cylinder region is delimited by the first longitudinal end and the second hollow cylinder region by the second longitudinal end; and
a conductor structure configured to generate magnetic field gradients in three mutually different directions, wherein the first hollow cylinder region is free from the conductor structure.

2. The gradient coil unit as claimed in claim 1, wherein the first hollow cylinder region has a length of at least 25 cm parallel to the cylinder axis.

3. The gradient coil unit as claimed in claim 1, wherein the second hollow cylinder region completely encompasses the conductor structural unit.

4. The gradient coil unit as claimed in claim 1, wherein the conductor structure is surrounded by casting compound.

5. The gradient coil unit as claimed in claim 1, wherein the first hollow cylinder region comprises reinforcing fibers.

6. The gradient coil unit as claimed in claim 4, wherein the first hollow cylinder region comprises reinforcing fibers, a density of the casting compound and a density of the reinforcing fibers differing by at most 5%.

7. The gradient coil unit as claimed in claim 4, wherein the first hollow cylinder region comprises reinforcing fibers, a rigidity of the reinforcing fibers being at least twice as high as a rigidity of the casting compound.

8. The gradient coil unit as claimed in claim 4, wherein the first hollow cylinder region comprises reinforcing fibers, the reinforcing fibers at an inner side directed toward the cylinder axis and/or at an outer side remote from the cylinder axis are covered by the casting compound.

9. The gradient coil unit as claimed in claim 5, wherein the reinforcing fibers are oriented in the circumferential direction of the first hollow cylinder region.

10. The gradient coil unit as claimed in claim 5, wherein a radial spatial extent of the reinforcing fibers corresponds to at least 20% of a radial spatial extent of the first hollow cylinder region.

11. The gradient coil unit as claimed in claim 5, wherein the reinforcing fibers comprise: glass, carbon, and/or glass fiber reinforced plastic (GRP).

12. The gradient coil unit as claimed in claim 1, wherein the conductor structure is asymmetrically designed in relation to each plane perpendicular to the cylinder axis.

13. The gradient coil unit as claimed in claim 1, wherein the conductor structure comprises at least five conductors each having different radial spacings from the cylinder axis, wherein a first conductor and a second conductor of the at least five conductors are configured to jointly generate a magnetic field gradient in a first direction of the three directions, and a third conductor of the at least five conductors is configured to compensate a stray magnetic field resulting on generation of a magnetic field gradient by the first conductor and/or the second conductor.

14. The gradient coil unit as claimed in claim 1, wherein a radial spatial extent of the first hollow cylinder region is smaller than a radial spatial extent of the second hollow cylinder region.

15. The gradient coil unit as claimed in claim 1, wherein the gradient coil unit has a length corresponding to a distance between the first longitudinal end and the second longitudinal end of at least 140 cm.

16. The gradient coil unit as claimed in claim 15, wherein the first hollow cylinder region has a length of at least 25 cm parallel to the cylinder axis.

17. A magnetic resonance device comprising:
a main magnet,
a shim cage configured to receive shim irons,
a radio-frequency coil unit, and
a gradient coil unit including:
    a hollow cylinder surrounding a cylinder axis, delimited perpendicularly to the cylinder axis by a first longitudinal end and a second longitudinal end opposing the first longitudinal end, the hollow cylinder including a first hollow cylinder region and a second hollow cylinder region separated from the first hollow cylinder region by a sectional plane perpendicular to the cylinder axis, wherein the first hollow cylinder region is delimited by the first longitudinal end and the second hollow cylinder region by the second longitudinal end; and
    a conductor structure configured to generate magnetic field gradients in three mutually different directions, wherein the first hollow cylinder region is free from the conductor structure,
wherein the shim cage is arranged between the main magnet and the gradient coil unit, the gradient coil at at least one radial position parallel to the cylinder axis having a greater length than the shim cage.

* * * * *